(12) United States Patent
Ishikawa

(10) Patent No.: US 6,251,550 B1
(45) Date of Patent: Jun. 26, 2001

(54) MASKLESS PHOTOLITHOGRAPHY SYSTEM THAT DIGITALLY SHIFTS MASK DATA RESPONSIVE TO ALIGNMENT DATA

(75) Inventor: Akira Ishikawa, Royse City, TX (US)

(73) Assignee: Ball Semiconductor, Inc., Allen, TX (US)

(*) Notice: Subject to any disclaimer, the term of this patent is extended or adjusted under 35 U.S.C. 154(b) by 0 days.

(21) Appl. No.: 09/348,369

(22) Filed: Jul. 7, 1999

Related U.S. Application Data

(60) Provisional application No. 60/092,377, filed on Jul. 10, 1998.

(51) Int. Cl.[7] ................................................. G03F 9/00
(52) U.S. Cl. ................................................. 430/22; 430/30
(58) Field of Search ............................. 430/5, 30, 22; 355/53; 702/126

(56) References Cited

U.S. PATENT DOCUMENTS

| | | | |
|---|---|---|---|
| 3,534,467 | 10/1970 | Sachs et al. | 29/583 |
| 4,126,812 | 11/1978 | Wakefield | 313/500 |
| 4,744,047 | 5/1988 | Okamoto et al. | 364/900 |
| 4,879,466 | 11/1989 | Kitaguchi et al. | 250/370.14 |
| 5,082,755 | 1/1992 | Liu | 430/5 |
| 5,131,976 | 7/1992 | Hoko | 156/630 |
| 5,138,368 | 8/1992 | Kahn et al. | 355/53 |
| 5,269,882 | 12/1993 | Jacobsen | 156/659.1 |
| 5,281,996 | 1/1994 | Bruning et al. | 355/77 |
| 5,361,272 | 11/1994 | Gorelik | 372/50 |
| 5,416,729 | 5/1995 | Leon et al. | 364/578 |
| 5,431,127 | 7/1995 | Stevens et al. | 117/75 |
| 5,461,455 | 10/1995 | Coteus et al. | 355/43 |
| 5,691,541 | 11/1997 | Ceglio et al. | 250/492.1 |
| 5,870,176 | 2/1999 | Sweatt et al. | 355/53 |
| 5,909,658 | 6/1999 | Clarke et al. | 702/126 |
| 5,955,776 * | 9/1999 | Ishikawa | 257/618 |
| 5,998,069 * | 12/1999 | Cutter et al. | 430/5 |
| 6,084,656 | 7/2000 | Choi et al. | 355/71 |

FOREIGN PATENT DOCUMENTS 0 552 953 A1    7/1993  (EP).
WO 91/10170    7/1991  (WO).

OTHER PUBLICATIONS

Singh–Gasson, Sangeet, et al., *Maskless Fabrication of Light–Directed Oligonucleotide Microarrays Using a Digital Micromirror Array*, vol. 17, No. 10, Oct. 1999, pp. 974–978.

Devitt, Terry, *Advance May Put Gene Chip Technology on Scientists' Desktops*, http://www.biotech.wise.edu/Education/biotechnews/GeneChip.html, Oct. 7, 1999.

Sandstrom and Odselius, "Large–Area High Quality Photomasks", Micronic Laser Systems, published by SPIE vol. 2621, pp. 312–318.

Exhibit A of USP 5,691,541 issued Nov. 25, 1997.

* cited by examiner

Primary Examiner—Mark F. Huff
Assistant Examiner—Saleha R. Mohamedulla
(74) Attorney, Agent, or Firm—Haynes and Boone LLP

(57) ABSTRACT

A maskless photolithography system for use in photolithography of a desired mask pattern on a photo resist coated subject includes a light source for projecting a collimated beam of light, a first lens system, and a pattern generator. The pattern generator is for generating the desired mask pattern according to prescribed mask pattern information. Upon receipt of the prescribed mask pattern information, the pattern generator generates a resident mask pattern therein to be imaged upon the photo resist coated subject. A mask pattern design system is provided for outputting the prescribed mask pattern information corresponding to the desired mask pattern to the pattern generator. The maskless photolithography system further includes a second lens system and a subject stage. The subject stage is provided for receiving the subject thereon during a photolithographic exposure, wherein light from the light source is directed through the first lens system, from the first lens system to the pattern generator and emanating from the pattern generator with the desired mask pattern, into the second lens system, and lastly onto the photo resist coated subject.

15 Claims, 1 Drawing Sheet

MASKLESS PHOTOLITHOGRAPHY SYSTEM THAT DIGITALLY SHIFTS MASK DATA RESPONSIVE TO ALIGNMENT DATA

CROSS REFERENCE

This application claims the benefit of U.S. Provisional Patent Application Ser. No. 60/092,377 filed Jul. 10, 1998, which is herein incorporated by reference.

BACKGROUND OF THE INVENTION

The present invention relates generally to semiconductor manufacturing equipment, and more particularly, to a photolithography system for use in the manufacture of semiconductor integrated circuit devices.

In conventional photolithography systems, the photolithography equipment requires a patterned mask to print a mask pattern on a photo resist coated surface or subject. The subject may include, for example, a semiconductor substrate. The conventional patterned mask or photomask may include, for example, a quartz glass mask. In addition, with the conventional photolighographic system, a photo resist coated subject must be aligned to the mask very accurately using some form of mechanical control and sophisticated alignment mechanism. The cost of the conventional patterned mask is very expensive also, in addition to a typically very long mask purchase lead time. The long mask purchase lead time is not very helpful when a short product development cycle is desired. Still further, if a particular mask design is found to require a design change in the pattern, no matter how small of a change, then mask modification cost and a respective lead time to implement the required change can cause serious problems in the manufacturing of the desired product.

In typical integrated circuit design activity, a particular mask may be modified or undergo modification on the order of seven to eight times, maybe even more, before completion of the design activities associated with a particular integrated circuit. Naturally, total cost of making the mask is very expensive and can become cost prohibitive. In addition, a corresponding total lead time becomes very long as a result.

Still further, in conventional photolithography systems for integrated circuit fabrication and other applications, such as printed circuit board manufacturing, the use of a printed mask is required for disposing a desired mask pattern onto a resist coated subject. The printed mask is typically made at a mask printing manufacturer or mask shop, for example, with the use of a very sophisticated electron beam direct writing system or photography system to print a desired design pattern onto a transparent substrate material, such as a quartz glass plate. In addition, highly sophisticated computer systems may also be necessary.

With respect to the manufacture of semiconductor integrated circuit devices, for example, one disadvantage with the use of a conventional patterned mask is that conventional patterned masks increase the manufacturing cost of the semiconductor integrated circuit devices. The use of conventional patterned masks furthermore undesirably lengthens a manufacturing cycle time in terms of a given mask purchase cycle time. Mask purchase cycle time includes the time involved in the purchasing of a desired mask from a mask vendor for use in the patterning of a photo resist coated surface. Still further, with a conventional patterned mask, when light is directed through the pattern thereof, for example where the pattern includes sub-micron slits and feature sizes, the light is subject to being diffracted in an undesirable manner. As a result, a complicated lens system is required to compensate for the effects of the undesired diffracted light.

Referring briefly now to FIG. 1, a conventional photolithography system 10 is illustrated. The photolithography system 10 includes a light source 12, a first lenses system 14, a printed mask 16, a mask alignment system 18, a second lenses system 20, a subject 22, and a subject alignment system 24. Subject 22 includes a photo resist coating 26 disposed thereon. During photolithography, light 28 emanates from the light source 12, through the first lenses system 14, the printed mask 16, the second lenses system 20, and onto the subject 22. In this manner, the pattern of the mask 16 is projected onto the resist coating 26 of the subject 22.

It would thus be desired to provide a photolithography system and method which overcomes the above mentioned problems in the art.

SUMMARY OF THE INVENTION

The present embodiment includes a novel photolithography system and method for photolithography which requires no use of conventional pattern masks for the printing of a pattern on a photo resist coated surface.

One feature of the present embodiments is that an electrical alignment is used, wherein the electrical alignment provides an improved alignment accuracy over that of a conventional mechanical alignment.

Another feature of the present embodiments includes an improved photolithography system wherein light diffraction problems associated with conventional photolithographic masks are eliminated.

Still further, another feature of the present embodiments is that the problems in the art as discussed herein above are overcome with the use of a computer generated mask pattern displayed with the use of an LCD display or through the use of micro mirror arrays.

According to one embodiment of the present disclosure, a maskless photolithography system includes a unique computer controlled pattern generator. Two types of pattern generation are used. In a first type of pattern generation, the pattern is produced with the use of a liquid crystal display or LCD panel. The first type of pattern generation is referred to herein as the LCD display method. In a second type of pattern generation, the pattern is produced with the use of micro mirror arrays or a digital mirror device (DMD). For the purpose of this invention, a digital mirror device is also referred to as a deformable mirror device. The second type of pattern generation is referred to herein as the DMD display method.

With the use of either of the two pattern generation methods as discussed herein for creating a pattern under computer control, the lithography system achieves a significant performance improvement over conventional lithography systems. In addition, with the present embodiments, conventional photolithography masks are not required. Still further, the requirement for an elaborate alignment system for use with the subject is eliminated, and thus no longer required. Lastly, the photolithography system cost is very much reduced, resulting from the elimination of the requirement for a precision mask stage and alignment system.

Furthermore, with respect to semiconductor manufacturing, conventional semiconductor integrated circuit mask making costs and the mask purchase cycle time for the photolithographic process are eliminated. In accordance with the present embodiments, no printed mask is required to be produced which advantageously eliminates any mask purchase cycle time. As a result, a semiconductor integrated circuit manufacturing process is further improved over known techniques with respect to the photolithography process steps. The manufacturing cycle time is improved (i.e., reduced).

BRIEF DESCRIPTION OF THE DRAWINGS

The foregoing and other teachings and advantages of the present invention will become more apparent upon a detailed description of the best mode for carrying out the invention as rendered below. However, it is understood that the following drawings are used for illustration purpose and do not represent all of the embodiments of the present invention. In the description to follow, reference will be made to the accompanying drawings, in which.

DETAILED DESCRIPTION

Figure 1:
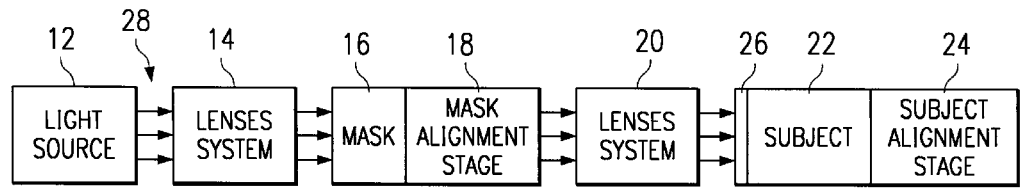
FIG. 1 illustrates a conventional photolithography system including a printed mask for use in the exposure of a photo resist coated subject.
Figure 2:
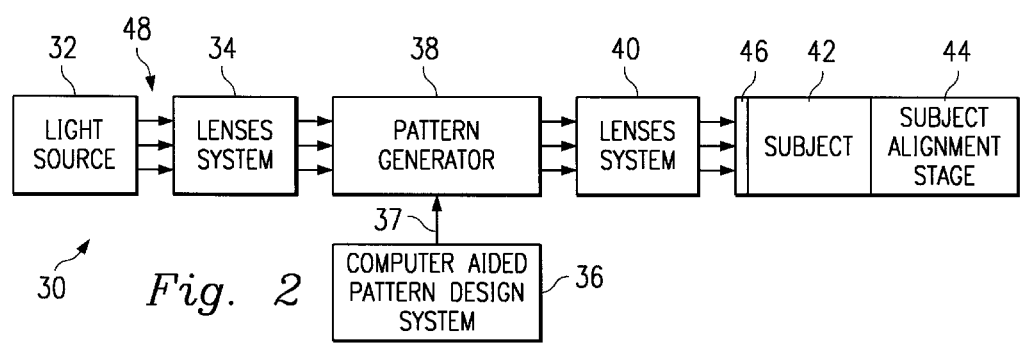
FIG. 2 illustrates a maskless photolithography system including a pattern generator and mask pattern design system according to the present disclosure.

With reference now to FIG. 2, the maskless photolithography system 30 of the present disclosure includes a light source 32, a first lenses system 34, a computer aided pattern design system 36, a pattern generator 38, a second lenses system 40, a subject 42, and a subject stage 44. A resist layer or coating 46 is disposed on the subject 42. Light source 32 provides a collimated beam of light 48 which is projected upon the first lenses system 34 and onto the pattern generator 38. The pattern generator 38 is provided with appropriate mask pattern signal information via suitable signal line(s) 37 from the computer aided pattern design system 36, wherein a desired mask pattern is made available and resident at the pattern generator 38 for a desired duration. Light emanating from the resident mask pattern of the pattern generator 38 then passes through the second lenses system 40 and onto the subject 42. In this manner, the pattern of the mask generator 38 is projected onto the resist coating 46 of the subject 42. Any modifications and/or changes required in the resident mask pattern can be made using the computer aided pattern design system 36. As a result, the need for fabrication of a new patterned printed mask, as would be required in conventional photolithography systems, is thus eliminated by the photolithography system 30 of the present disclosure.

The present photolithography system 30 thus advantageously eliminates the conventional photomask requirement in the patterning of a subject with a desired pattern. As a result, substantial cost savings are realized in the manufacture of subjects which require the use of a patterning of a photo resist coated subject.

The present photolithography system 30 furthermore reduces a lead time associated with obtaining a particular mask pattern, in addition to a reduced repair time in the event that changes to the mask pattern become necessary after an initial design implementation. In other words, the lead time and repair time of producing a pattern are almost negligible, that is, the lead time and repair time are very quick in comparison with conventional mask generation for a particular integrated circuit design activity.

Figure 3:
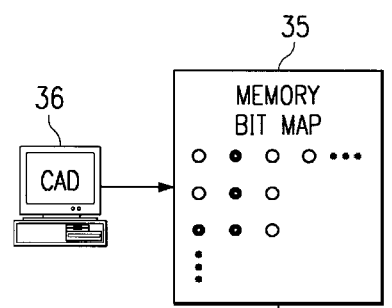
FIG. 3 presents the pattern generator and mask pattern design system of FIG. 2 in further detail.

Referring now to FIG. 3, the computer aided mask design system 36 is used for the creation of mask pattern information for a desired mask pattern. The mask pattern information, for example, can be stored in memory in the form of a bit map 35 or the like. The bit map 35 can include individual pixel data, which is subject to easy modification as may be required for the development of a particular integrated circuit design and/or mask pattern design.

The computer aided pattern design system 36 includes a computer aided mask pattern design system similar to that which is currently used for the creation of mask making data information for use in the manufacture of a conventional printed mask. The mask making data information includes mask data necessary for the creation of a particular mask. With the use of the computer aided pattern design system 36, any bit can be easily changed or its location moved in a particular mask pattern. Any given mask pattern can be changed as needed almost instantly with the use of an appropriate instruction from the computer aided pattern design system 36. Regardless of the complexity of a given mask pattern, the present embodiment may also be used for finalizing a given mask pattern from initial design through any and all necessary design changes and/or modifications. Once finalized, for example, with the use of the photolithography system 30 of the present disclosure, the mask pattern information may also be used for the creation of a conventional printed mask, wherein the conventional mask can be for use in a conventional photolithography system.

With the conventional photolithography systems, precise and very accurate mask alignment and subject alignment systems are required. Referring still to FIG. 3, the present photolithography system 30 advantageously overcomes the requirement for both precise and very accurate mask alignment and subject alignment systems by including an ability to make accurate and precise pattern alignment adjustments electronically via a suitable computer assisted alignment using the computer aided pattern design system 36. That is, a particular mask pattern information can be modified readily for obtaining a prescribed alignment, for example, by the shifting of a mask pattern image in the bit map 35 as needed to obtain the desired alignment.

As discussed above, the method and system embodiments of the present disclosure include programmable mask pattern generation with the use of the computer aided pattern design system 36 and pattern generator 38. That is, the mask pattern to be transferred to the photo resist coated surface of the subject 42 is a programmable mask pattern. Thus, with a programmable mask pattern, any portion of the pattern on the subject 42 can be manipulated and/or changed as desired for rendering of desired changes as may be needed, furthermore, on a significantly reduced cycle time, i.e., almost instantly.

In one embodiment of the present disclosure, the photolithography system 30 includes a liquid crystal display panel for use as a pattern generator 38 (FIG. 3). With the liquid crystal display panel, light passes through the display panel and onto the subject 42 being exposed with the mask pattern. That is, light enters a first side 38a of the LCD panel and emanates from an opposite side 38b of the LCD panel with the mask pattern information contained therein. The mask pattern information is provided to the LCD panel via signal line(s) 37 from the computer aided mask pattern design system 36.

In a second embodiment of the present disclosure, the photolithography system 30 of the present disclosure includes a micro mirror device. With the micro mirror device, light is reflected according to the pattern of pixels as controlled according to a prescribed pixel/bit mask pattern received from computer aided mask design system 36. The light reflecting from the micro mirror device thus contains the desired mask pattern information.

As discussed above, in the second embodiment, the pattern generator 38 includes a micro mirror array. Such a micro mirror array may include any suitable light valve, for example, such as that used in projection television systems and which are commercially available. The light valves are also referred to as deformable mirror devices or digital mirror devices (DMD). One example of a DMD is illustrated in U.S. Pat. No. 5,079,544 and patents referenced therein, in which the light valve consists of an array of tiny movable mirror-like pixels for deflecting a beam of light either to a display screen (ON) or away from the display optics (OFF). The pixels of the light valve device are also capable of being switched very rapidly. Thus, with the use of the light valve, the photolithography system 30 of the present disclosure can implement changes in the mask pattern in a relatively quick manner. The light valve is used to modulate light impinging thereon in accordance with a mask pattern information signal 37 provided by the computer aided pattern design system 36. In addition, the DMD reflects light, thus no appreciable loss in intensity occurs when the patterned light is projected upon the desired subject during the lithographic mask exposure.

With respect to providing a given mask pattern/subject alignment, according to an embodiment of the present disclosure, the mask pattern is shifted in one or more directions for achieving a desired mask alignment on the subject. Alignment is accomplished with the assistance of the computer aided pattern design system 36. Adjustments in alignment are carried out electronically in the mask bit pattern information provided to the light valve. As a result, no special mechanical alignment system is required for the mask or for the subject being exposed. Adjustments in pattern alignment can thus be easily accomplished.

Figure 4:
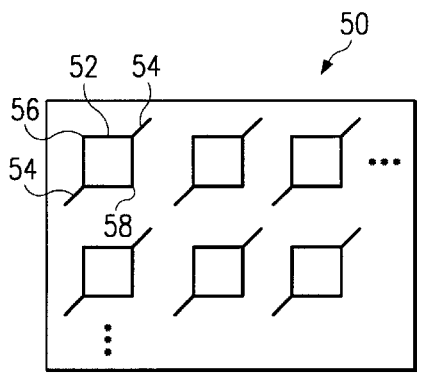
FIG. 4 is a schematic plan view of the surface of a deformable mirror device (DMD) type light valve or micro mirror array showing the orientation of the hinges of the individual pixels.
Figure 5:
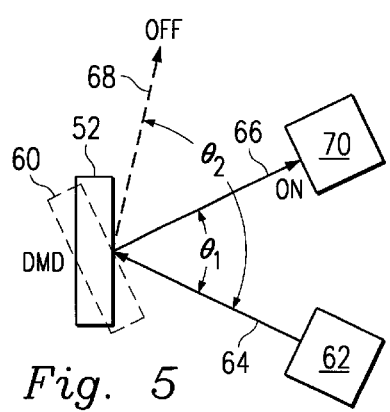
FIG. 5 is a diagram illustrating the angular separation of the incident, ON, and OFF light beams of a micro mirror pixel of a light valve for use with the maskless photolithography system of the present disclosure.

FIG. 4 illustrates a light valve 50 in the form of a deformable mirror device (hereinafter referred to as "DMD") having an array of reflective pixels 52. Each pixel 52 is mounted so as to be pivotable about torsion hinges 54 which are located at two diagonal corners of each pixel. In operation, when an appropriate ON voltage is applied to pixel 52, the upper lefthand corner 56 of the pixel 52 will move upwardly from the plane of the DMD 50 while the lower right-hand corner 58 will move downwardly. Similarly, when an OFF voltage is applied, pixel 52 will pivot about torsion hinges 54 so that corner 56 moves downwardly and corner 58 moves upwardly. Thus the ON and OFF positions comprise two distinct movements of each pixel 52. Generally, pixels 52 can be pivoted by 10° to either side of planar. In the ON position, the incident illumination is reflected into the aperture of the second lenses system. In the OFF position, the incident illumination is reflected outside the aperture of the second lenses system and thus does not reach the subject being exposed. The operation of the DMD is illustrated in FIG. 5. DMD 50 may also include a so called "hidden hinge" configuration in which the hinges for the individual pixels are disposed underneath the pixels.

FIG. 5 illustrates the light path resulting from the switching of pixels 52. In FIG. 5, the pixel 52 is in its ON position and the pixel 52 shown in dotted line 60 illustrates the planar position of pixel 52 when pivoted into its OFF position. An illumination system schematically illustrated at 62 provides a beam of incident light 64 upon the surface of each pixel 52. When pixel 52 is in the ON position, the incident beam 64 will be reflected as a beam 66 to the second lenses system 70 which will project beam 66 onto the subject 42 being exposed. When pixel 52 is activated and pivoted into its OFF position, incident beam 64 will be reflected to an "OFF" beam 68 which is outside of the angle of acceptance of the second lenses system 70, so that no light will reach the subject from the OFF position of pixel 52. The angle that is necessary to completely switch the pixel 52 to the "OFF" position can be calculated by the formula:

$$\text{Pivotal Angle} = (\theta_2 - \theta_1) \div 2$$

where $\theta_2$ is the angle formed between the incident beam 64 and the reflection beam 66, and $\theta_2$ is the angle formed between the incident beam 64 and the reflection beam 68 respectively.

A given resolution of the maskless lithography system 30 of the present disclosure is dependent upon the particular optical system used for the first and second optical lenses systems, 34 and 40, respectively. In addition, the number of pixels of a given pattern generator 38 or light valve, for example, corresponding to the number of pixels of the liquid crystal display or that of the micro mirror array, also influences the resolution of the maskless lithography system 30 of the present disclosure. For a fixed area, the larger the number of pixels and/or increased magnification, the greater the resolution of the lithography system 30.

As discussed herein, the lithography system 30 of the present disclosure includes a computer controlled pattern generator 38. According to the disclosed embodiments, two types of pattern generation are used. In a first type of pattern generation, the pattern is produced with the use of a liquid crystal display or LCD panel. The first type of pattern generation is referred to herein as the LCD display method. In a second type of pattern generation, the pattern is produced with the use of micro mirror arrays, light valve, or deformable mirror device (DMD). The second type of pattern generation is referred to herein as the DMD display method. With the use of either of the two pattern generation methods as discussed herein for creating a mask pattern under computer control, the lithography system 30 achieves a significant performance improvement over conventional lithography systems.

With the present embodiments, conventional photolithography masks are not required. The lithography system 30 of the present disclosure thus advantageously eliminates various matters and procedures associated with the handling, cleaning, and storage of traditional masks which are used in conventional photolithography systems. Lastly, the photolithography system cost is very much reduced, resulting from the elimination of the requirement for a precision mask stage and alignment system.

With respect to semiconductor device and integrated circuit manufacturing and the present embodiments, conventional semiconductor integrated circuit mask making cost and the mask purchase cycle time for the photolighographic process are eliminated. In accordance with the present embodiments, no printed mask is required to be produced which eliminates any mask purchase cycle time. As a result, a semiconductor integrated circuit manufacturing process is further improved over known techniques with respect to the photolithography process steps. That is, the manufacturing cycle time is improved (i.e., reduced). The present maskless photolithographic method and apparatus are applicable for use in the patterning of spherical semiconductor substrates. The present maskless photolithographic method and apparatus are further applicable for use in the patterning of planar semiconductor wafers.

Another feature of the present embodiments is that an electrical alignment is used. The electrical alignment provides for an improved alignment accuracy over that of a conventional mechanical alignment. The present embodiments advantageously overcome the problems in the art as discussed herein above with the use of a computer generated pattern displayed on an LCD display or through the use of micro mirror arrays.

With respect to manufacture of spherical substrates, the present photolithography system of the present disclosure is highly useful for the patterning of such spherical substrates. A method and apparatus for manufacturing sphericalshaped semiconductor integrated circuit devices is disclosed in co-pending U.S. Pat. No. 5,955,776 filed on May 16, 1997, entitled "Spherical Shaped Semiconductor Integrated Circuit" and assigned to the same assignee as the present application, further incorporated herein by reference. The manufacturing of spherical shaped semiconductor integrated circuit devices as disclosed in Ser. No. 08/858,004 involves a continuous atmospheric semiconductor IC manufacturing process. In the patterning of a spherical substrate, for example, a forty-five (45) mirror lithography exposure system could be used, which can also include the use of an equal number of micro mirror arrays or DMDs. Each micro mirror array or DMD may include, for example, one million mirror pixels per array or device. With one million mirror pixels per device, a 0.2 micron resolution may possibly be achieved using an approximate fifty to one (50 to 1) ratio. The present lithography system 30 thus enables the economical and advantageous finalizing of a given mask pattern to be achieved without the use of a conventional printed mask and conventional photolithography system. In other words, the present maskless photolithography system enables a semiconductor manufacturer to implement design changes as necessary, until a finalized design is achieved, without encountering the problems as discussed herein associated with the use of conventional printed masks. Disadvantages of the conventional printed masks are thus avoided. The present maskless photolithography system further supports a fully automated semiconductor integrated circuit manufacturing and processing situation.

While the invention has been particularly shown and described with reference to the preferred embodiments, or examples thereof, it will be understood by those skilled in the art that various changes in form and detail may be made therein without departing form the spirit and scope of the invention, as set forth in the following claims.

What is claimed is:

1. A method for maskless photolithography of a desired mask pattern on a photo resist coated subject, said method comprising the steps of:

receiving alignment information into a pattern system;

receiving mask pattern information into the pattern system;

digitally shifting the mask pattern information responsive to the alignment information;

providing the shifted mask pattern information to a pattern generator;

generating the desired mask pattern according to the shifted mask pattern information;

projecting a collimated beam of light through the pattern generator; and masking the collimated beam of light according to the desired mask pattern;

wherein the subject may receive the masked beam of light thereon during a photolithographic exposure.

2. The method of claim 1, wherein the pattern generator includes a transmissive liquid crystal display panel, and wherein the collimated beam of light enters a first side thereof and emanates out of an opposite side thereof.

3. The method of claim 1, wherein the pattern generator includes a reflective micro mirror array, the micro mirror array including an array of micro mirrors, wherein the collimated beam of light is incident at a first angle and emanates from a second angle different from the first angle in accordance with the desired mask pattern.

4. The method of claim 3, further wherein each micro mirror of the array corresponds to a pixel of mask pattern information.

5. The method of claim 1, wherein the resist coated subject includes a resist coated semiconductor wafer.

6. The method of claim 1, wherein the resist coated subject includes a resist coated spherical semiconductor substrate.

7. A method of maskless photolithography for generating a desired mask pattern on a photo resist coated subject, said method comprising the steps of:

providing a mask pattern design system for outputting mask pattern information corresponding to the desired mask pattern and adjustment information, wherein the adjustment information serves to digitally shift the desired mask pattern in at least one direction according to an alignment between the subject and a pattern generator; and providing the pattern generator for generating the desired mask pattern according to the mask pattern information provided by the mask pattern design system, wherein upon receipt of the mask pattern information, the pattern generator generates a resident mask pattern therein to be imaged upon the photo resist coated subject.

8. The method of claim 7 further comprising the steps of:

providing a light source for projecting a collimated beam of light; and providing a lens system having a first lens assembly set up between the light source and the mask pattern generator and a second lens assembly set up between the mask pattern generator and the photo resist coated subject.

9. The method of claim 8 further comprising the step of:

providing a subject stage having an alignment stage for receiving the photo resist coated subject during a photolithographic exposure, wherein the mask pattern is aligned with the photo resist coated subject and the collimated beam of light is directed through the first lens assembly, from the first lens assembly to the mask pattern generator and emanating from the pattern generator with the desired mask pattern into the second lens assembly, and lastly onto the photo resist coated subject.

10. The method of claim 7, wherein the pattern generator includes a transmissive liquid crystal display panel for displaying the desired mask pattern and emanating light in accordance with the desired mask pattern in a photolithographic exposure process.

11. The method of claim 7, wherein the pattern generator includes a reflective micro mirror array, the micro mirror array including an array of micro mirrors for receiving light at a first angle and emanating light at a second angle different from the first angle in accordance with the desired mask pattern during a photolithographic exposure process.

12. The method of claim 11, further wherein each micro mirror of the array corresponds to a pixel of mask pattern information.

13. The method of claim 7, wherein the mask pattern information includes mask pattern alignment information, the pattern generator responding to the mask pattern alignment information for providing a prescribed alignment of the desired mask pattern on the photo resist covered subject.

14. The method of claim 7, wherein the resist coated subject includes a resist coated semiconductor wafer.

15. The method of claim 7, wherein the resist coated subject includes a resist coated spherical semiconductor substrate.

* * * * *